Figure 1:
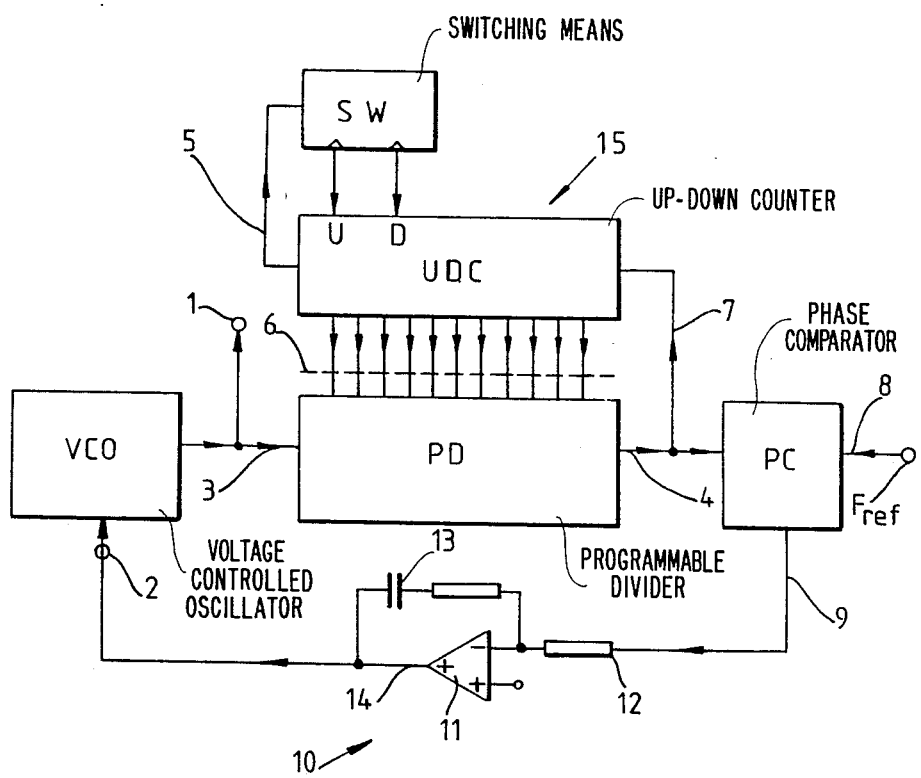

United States Patent [19]
Walters

[11] Patent Number: 4,931,749
[45] Date of Patent: Jun. 5, 1990

[54] PHASE LOCKED LOOP SWEEP FREQUENCY SYNTHESIZER

[75] Inventor: Nigel J. Walters, Horsham, England

[73] Assignee: U.S. Philips Corporation, New York, N.Y.

[21] Appl. No.: 258,404

[22] Filed: Oct. 17, 1988

[30] Foreign Application Priority Data

Nov. 25, 1987 [GB] United Kingdom ............... 8727564

[51] Int. Cl.⁵ .................... H03B 23/00; H03L 7/12
[52] U.S. Cl. ........................................ 331/4; 331/178
[58] Field of Search ................................. 331/4, 178

[56] References Cited

U.S. PATENT DOCUMENTS

| | | | |
|---|---|---|---|
| 3,364,437 | 1/1968 | Loposer et al. | 331/178 X |
| 3,962,653 | 6/1976 | Basset | 331/4 X |
| 4,380,743 | 4/1983 | Underhill et al. | 331/16 X |

FOREIGN PATENT DOCUMENTS

2068185 8/1981 United Kingdom ............... 331/17

Primary Examiner—Siegfried H. Grimm
Attorney, Agent, or Firm—Robert T. Mayer

[57] ABSTRACT

A frequency synthesizer is provided in which the output is a truly continuous sweep of frequency, not a staircase of spot frequencies. A programmable frequency divider PD is connected to the output of a voltage-controlled oscillator (VCO) to divide the VCO output by a variable integer N. At each VCO output cycle, the integer N is incremented (or decremented). The output of a phase comparator PC, which compares the divider output with a fixed reference frequency, is connected via an integrator (10) to the VCO frequency control input (2). A constant phase error produces a ramp rise of VCO frequency.

6 Claims, 1 Drawing Sheet

PHASE LOCKED LOOP SWEEP FREQUENCY SYNTHESIZER

This invention relates to frequency synthesizers and more particularly to frequency synthesizers of the phase lock loop type comprising a voltage-controlled oscillator (VCO) the output frequency of which forms the synthesizer output, a programmable frequency divider connected to the VCO output, which divider is arranged to divide the output frequency by a selectively variable integer N, control means for setting the value of N in the divider, a phase comparator having a first input connected to the output of the divider and a second input for connection to a reference frequency source, and a loop filter connected between the output of the phase comparator and a frequency control input of the VCO, whereby the output frequency is controlled to equal the Nth multiple of the reference frequency.

Such a frequency synthesizer is disclosed in British Patent Specification No. 1,444,860 to which U.S. Pat. No. 4,024,464 corresponds in which the value of N may, for example, range from 1 to 1000.

However, in many types of electronic equipment the requirement is not for a single defined frequency source or for a set of defined frequency sources but for a single source which can be swept continuously, and usually repetitively, over a range of frequencies. Such equipment may comprise a spectrum analyser, or a continuous wave frequency modulation radar, or a chirp sounding equipment. The precision of the analysis of the results obtained with such equipment is greatly improved if the swept frequency range is accurately defined and particularly if the sweep of frequency is linear as a function of time during each sweep.

It is an object of the present invention to provide a frequency synthesizer in which a closely linear continuous sweep of frequencies is obtained.

According to the present invention there is provided a frequency synthesizer of the phase lock loop type comprising a voltage-controlled oscillator (VCO) the output frequency of which forms the synthesizer output, a programmable frequency divider connected to the VCO output, which divider is arranged to divide the output frequency by a selectively variable integer N, control means for setting the value of N in the divider, a phase comparator having a first input connected to the output of the divider and a second input for connection to a reference frequency source, and a loop filter connected between the output of the phase comparator and a frequency control input of the VCO, whereby the output frequency is controlled to equal the Nth multiple of the reference frequency, characterised in that the output of the divider is connected to the control means, in that the control means comprise means for incrementing or decrementing N by a predetermined value at each periodic time of the divider output, and in that the loop filter comprises an integrator, whereby the output frequency is controlled to sweep at a substantially linear rate.

For a more linear sweep the frequency synthesizer may be characterised in that the phase comparator is of a type which provides constant output voltage for a constant phase error. For example, the phase comparator may be of the sample and hold type. Other types of phase comparator may be used with suitable filtering in less demanding applications. A frequency synthesizer made in accordance with the invention provides a truly continuous sweep of frequency, not a staircase of spot frequencies.

The reference frequency source may be provided from a stable frequency source, such as a crystal controlled oscillator, either directly, or by frequency division. In the latter case the division factor may be made variable so allowing a range of values of the reference frequency $F_{ref}$, each of which is defined with crystal controlled precision.

The integer N may be stepped, or incremented, from an initial value $N_i$ to a final value $N_f$. The initial and final values of the VCO output frequency are then $N_i.F_{ref}$ and $N_f.F_{ref}$ and are hence also defined with crystal controlled precision. The presence of the integrator in the phase lock loop causes a ramp voltage to be applied to the VCO for a constant output from the phase comparator which occurs when there is a constant phase difference between the two signals at its input. Only small corrective changes in the rate of change of VCO frequency occur, which are needed to maintain a near constant phase difference between the reference frequency and the divided VCO frequency, which in turn provides a nearly constant d.c. input to the integrator throughout the ramp. In the event that the VCO control characteristic is non-linear, small changes in the phase difference will occur such that changes in the rate of change of the VCO input signal compensate for the non-linearity. Thus, the VCO frequency changes continuously but remains closely locked to the values $N.F_{ref}$ at the periodic intervals of $F_{ref}$. Hence the linearity of VCO frequency ramp, or sweep, as a function of time is assured in spite of a non-linear VCO characteristic. It is only necessary that the VCO characteristic should be monotonic.

The frequency synthesizer made in accordance with the invention may be characterised in that the control means comprise a counter connected to count the periods of the divider output, and in that the contents of the counter comprise the integer N. The integer N is thereby incremented by unity at each period of the divider output. The frequency synthesizer made in accordance with the invention may also be characterised in that the counter is an up/down counter, and in that the control means comprise means for switching the up/down counter to count up from a first count to a second count and then to count down to the first count. Thus the VCO frequency can be made to rise on a linear ramp followed by a fall on a linear ramp of the same slope, generating a triangular frequency characteristic.

The frequency synthesizer made in accordance with the invention may also be characterised in that the control means comprise means for adding a predetermined number to the contents of an accumulator at each periodic time of the divider output, and in that the contents of the accumulator comprise the integer N. Thus, at each divider output the value of N is incremented by an integral number, constant throughout the ramp, which is greater than unity. Steeper frequency ramps can thus be generated having a steepness proportional to the value of the integral number chosen.

The frequency synthesizer made in accordance with the invention may be further characterised in that the programmable frequency divider comprises a second counter connected to the control means to be set to the integer N and to count down to zero at which the divider output is provided and the second counter is reset to N. Such a counter can be assembled simply from readily available binary or decimal counters.

An embodiment of the invention will now be described, by way of example, with reference to the accompanying drawing in which FIG. 1 shows a block schematic circuit diagram of a frequency synthesizer made in accordance with the invention.

A voltage controlled oscillator VCO is provided, the output frequency of which, at terminal 1, forms the synthesizer output. The VCO comprises a frequency control voltage input terminal 2 to which a control voltage is applied to set the value of the VCO frequency. Typically the VCO may comprise an oscillator having a tuned circuit in which the capacitance includes a varactor diode. The control voltage is applied as a reverse bias to the diode, the value of the capacitance being controlled by the value of the control voltage. Such voltage controlled oscillators are well known in the art and will not be described further. By way of illustration numerical values will be given for one specific design of swept frequency synthesizer. In this design the VCO frequency is swept from 10 to 11 MHz and it is assumed that the requirement is to make this sweep of frequency in 10 milliseconds. It will be shown later that in this case the reference frequency required is 10 KHz.

A programmable frequency divider PD is connected to receive the VCO output as a sinusoidal signal on input 3, convert it to pulse form, and to divide the pulse frequency by a selectively variable integer N. In this specific design, the initial value $N_i$ of N is 1000 and the final value $N_f$ is 1100. The programmable divider PD of this design consists of a group of four divide-by-ten counters connected in series and which can each be set to an initial count. The divider counters are connected to count down from a set value N to zero at which an output pulse is provided on output 4. The divide-by-ten counters of PD may each be an integrated circuit, for example, a TEXAS 74 LS 161 (Trade Mark).

Control means 15 are provided for setting the value of N in the divider PD. In this embodiment the control means comprise an up/down counter UDC and switching means SW for switching UDC to count up U from a first count to a second count and then to count down D to the first count. UDC provides an output on connection 5 to switch SW when UDC reaches the first or the second count, $N_i$ or $N_f$ respectively. UDC provides outputs in binary coded decimal on connections 6 to set integer N into PD. The output 4 from PD is fed to UDC on connection 7 to increase, or decrease, the count N in UDC by unity and to set the increased count, N+1, into PD. UDC may comprise two TEXAS 74 LS 190 integrated circuits in this design.

The output 4 from PD is also fed to a phase comparator PC. A reference frequency $F_{ref}$, 10 KHz in this specific design, is applied to PD on input 8. PD provides a d.c. output signal on connection 9 which is zero if the phases of $F_{ref}$ and output 4 are equal and is increasingly positive or negative in value as the phase of output 4 is increasingly in retard or in advance respectively of the phase of $F_{ref}$. British Patent Specification No. 1,462,408 describes such a phase comparator and the circuit details will not be described further here.

Output 9, the phase error signal, is fed to the frequency control input terminal 2 of VCO via a loop filter 10 which comprises an integrator. The integrator comprises a high gain d.c. amplifier 11. An input resistor 12 is connected to the negative input terminal of the amplifier and to output 9. An integrating capacitor 13 is connected between the positive output 14 of the amplifier and its negative input. A steady, non-zero, value on output 9 produces a steadily increasing voltage on output 14. Thus a constant phase difference between the divider output 4 and $F_{ref}$ produces a steadily increasing output frequency from VCO. The connections of the loop are arranged so that, if output 4 falls behind $F_{ref}$ in phase, the phase error signal 9 produces an increase in the rate of rise of VCO frequency and hence, via PD, produces an advance in phase of output 4 to correct the phase lag.

The intervals between successive output pulses 4 may be referred to as the comparison period. With the loop in lock, the successive increases in the integer N necessarily follow at intervals of the $F_{ref}$ period, which may be chosen to be highly stable. Thus at the end of each comparison period the rate of increase of VCO frequency must have been such that one more VCO cycle has been fitted into the comparison period as compared with the previous comparison period. Thus the VCO frequency increases by a constant amount in each comparison period and hence is a closely linear increase.

The linearity of the VCO output frequency as a function of time is dependent only to a very small degree on the linearity of VCO frequency as a function of the frequency control input voltage 2. As an example, the rate of rise of VCO frequency with control input 2 may fall off with increasing control voltage. The effect will be to produce a slight increase in phase error at each comparison period which in turn will produce an increase of integrator input. This then produces an increase in the rate of rise of control input voltage 2 which provides constant rate of rise of VCO frequency.

When the count in UDC has risen to 1100, a switch output on connection 5 is provided to change UDC from counting up to counting down. Similarly when the UDC count falls to 1000 the switch output changes UDC to counting up. Thus, this swept frequency synthesizer generates a triangular sweep of frequency. In this specific design, there are 100 changes of N during a sweep up or down, each change taking place at intervals of 100 microseconds, the $F_{ref}$ period. Thus the sweep duration is $100 \times 100$ μsec = 10 msec as required.

The design equation for a swept frequency synthesizer made in accordance with the invention can be derived as follows. If the initial output frequency is $F_i$, the final output frequency is $F_f$, and the reference frequency is $F_{ref}$, then $$N_i = \frac{F_i}{F_{ref}} \tag{a}$$

and $$N_f = \frac{F_f}{F_{ref}} \tag{b}$$

where $N_i$ and $N_f$ are the initial and final values of the division ratio N of the programmable divider. The total number S of values of N during the whole ramp is given by $$S = N_f - N_i \quad (1)$$
$$= \frac{F_f}{F_{ref}} - \frac{F_i}{F_{ref}}$$
$$= \frac{1}{F_{ref}}(F_f - F_i)$$

The changes of N are made at intervals of the periodic time, $1/F_{ref}$, of the reference frequency, herein termed the comparison period. The total duration T of the ramp is given by the product of S and the comparison period, $$T = S \cdot \frac{1}{F_{ref}} \quad (2)$$

Substituting for S from equation 1, $$T = (F_f - F_i)/(F_{ref})^2 \quad (3)$$

from which $$F_{ref} = \sqrt{\frac{F_f - F_i}{T}} \quad (4)$$

The quantity under the square root sign of equation (4) is the slope of the ramp in Hertz per second, i.e. the rate of change of frequency.

In the more usual practical applications of the invention, $F_i$, $F_f$ and T, and hence the slope of the ramp, will be specified by the external conditions of the application. Using equation (4), the reference frequency is calculated. The values of $N_i$ and $N_f$ can then be calculated from equations (a) and (b) above.

In other applications of the invention, another set of three of the parameters may be specified externally, from which the remaining parameters can be calculated. For example the three frequencies $F_i$, $F_f$ and $F_{ref}$ may be specified by external considerations. Equation 3 then allows the ramp duration T to be calculated and, as before, equations (a) and (b) give the values of $N_i$ and $N_f$.

If the up/down counter is replaced by a successive addition rate multiplier, N is then incremented by an integer m at each comparison period. In this event, $$\dot{S} = \frac{N_f - N_i}{m} \quad (5)$$
$$= \frac{1}{m F_{ref}}(F_f - F_i)$$

from which $$T = (F_f - F_i)/(m F_{ref})^2 \quad (6)$$

$$F_{ref} = \sqrt{\frac{F_f - F_i}{mT}} \quad (7)$$

If $F_f$, $F_i$ and $F_{ref}$ are held constant and m is increased to values 2, 3, 4, . . . etc., the ramp time T decreases in proportion. Thus, using a successive addition rate multiplier, a range of ramp rates between the same initial and final values of frequency can be obtained.

I claim:

1. A frequency synthesizer of the phase lock loop type comprising a voltage-controlled oscillator (VCO) the output frequency of which forms the synthesizer output, a programmable frequency divider connected to the VCO output, which divider is arranged to divide the output frequency by a selectively variable integer N, control means for setting the value of N in the divider, a phase comparator having a first input connected to the output of the divider and a second input for connection to a reference frequency source, and a loop filter connected between the output of the phase comparator and a frequency control input of the VCO, whereby the output frequency is controlled to equal the Nth multiple of the reference frequency, characterized in that the output of the divider is connected to the control means, in that the control means comprise means for incrementing or decrementing N by a predetermined value at each periodic time of the divider output, and in that the loop filter comprises an integrator, whereby the output frequency is controlled to sweep at a substantially linear rate.

2. A frequency synthesizer as claimed in claim 1, characterized in that the phase comparator is of a type which provides constant output voltage for a constant phase error.

3. A frequency synthesizer as claimed in claim 2, characterized in that the phase comparator is of the sample and hold type.

4. A frequency synthesizer as claimed in any one of claims 1 to 3, characterized in that the control means comprise a counter connected to count the periods of the divider output, and in that the contents of the counter comprise the integer N.

5. A frequency synthesizer as claimed in claim 4, characterized in that the counter is an up/down counter, and in that the control means comprise means for switching the up/down counter to count up from a first count to a second count and then to count down to the first count.

6. A frequency synthesizer as claimed in claim 4, characterized in that the programmable frequency divider comprises a second counter connected to the control means to be set to the integer N and to count down to zero at which the divider output is provided and the second counter is reset to N.

* * * * *